(12) United States Patent
Ma et al.

(10) Patent No.: US 10,645,820 B2
(45) Date of Patent: May 5, 2020

(54) DISPLAY DEVICE

(71) Applicant: BOE TECHNOLOGY GROUP CO., LTD., Beijing (CN)

(72) Inventors: Yongda Ma, Beijing (CN); Yong Qiao, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/745,191

(22) PCT Filed: Jul. 28, 2017

(86) PCT No.: PCT/CN2017/094830
§ 371 (c)(1),
(2) Date: Jan. 16, 2018

(87) PCT Pub. No.: WO2018/076843
PCT Pub. Date: May 3, 2018

(65) Prior Publication Data
US 2019/0014668 A1     Jan. 10, 2019

(30) Foreign Application Priority Data

Oct. 28, 2016 (CN) .................... 2016 2 1197628 U

(51) Int. Cl.
*H05K 5/00* (2006.01)
*G09F 9/00* (2006.01)
*G02F 1/1333* (2006.01)

(52) U.S. Cl.
CPC ..... *H05K 5/0004* (2013.01); *G02F 1/133308* (2013.01); *G09F 9/00* (2013.01);
(Continued)

(58) Field of Classification Search
None
See application file for complete search history.

(56) References Cited

U.S. PATENT DOCUMENTS

| 4,197,545 A | 4/1980 | Favaloro et al. |
| 5,146,390 A * | 9/1992 | Wong ................ G01R 1/04 |
| | | 174/138 G |

(Continued)

FOREIGN PATENT DOCUMENTS

| CN | 101029980 A | 9/2007 |
| CN | 101783435 A | 7/2010 |

(Continued)

OTHER PUBLICATIONS

Search Report and Written Opinion for International Application No. PCT/CN2017/094830 dated Nov. 10, 2016.

*Primary Examiner* — Xanthia C Cunningham
(74) *Attorney, Agent, or Firm* — Calfee, Halter & Griswold LLP

(57) ABSTRACT

A display device includes a front frame positioned at a light emitting side of the display device; a backlight module; a display panel positioned between the front frame and the backlight module; and a connecting rod passing through the backlight module and connected to the front frame. Wherein the backlight module includes a panel installation region corresponding to a position of the display panel and a peripheral region adjacent to the panel installation region, and the connecting rod is positioned in the peripheral region.

19 Claims, 9 Drawing Sheets

(52) U.S. Cl.
CPC . *H05K 5/0017* (2013.01); *G02F 2001/13332* (2013.01); *G02F 2001/133314* (2013.01); *G02F 2201/46* (2013.01)

(56) References Cited

U.S. PATENT DOCUMENTS

| | | | | |
|---|---|---|---|---|
| 5,579,036 | A * | 11/1996 | Yates, IV | G06F 3/044 178/18.06 |
| 5,594,574 | A * | 1/1997 | Lara | G02F 1/133308 349/58 |
| 6,532,152 | B1 * | 3/2003 | White | G02F 1/133308 312/223.1 |
| 6,597,416 | B1 * | 7/2003 | Momose | G02F 1/13452 349/149 |
| 6,770,813 | B1 * | 8/2004 | Ramsagar | B60R 16/0207 174/525 |
| 6,879,318 | B1 * | 4/2005 | Chan | G02F 1/133308 178/18.01 |
| 8,174,838 | B2 * | 5/2012 | Kanda | H05K 7/142 361/752 |
| 8,289,721 | B2 * | 10/2012 | Mori | H05K 7/142 174/138 G |
| 8,441,797 | B2 * | 5/2013 | Mochizuki | H05K 1/0243 361/736 |
| 8,477,257 | B2 | 7/2013 | Nakano | |
| 8,564,938 | B2 * | 10/2013 | Horii | H05K 7/02 361/679.01 |
| 8,811,033 | B2 * | 8/2014 | Suetomi | G06F 3/03547 292/251 |
| 9,232,675 | B2 * | 1/2016 | Schurr | H05K 5/0017 |
| 9,454,177 | B2 * | 9/2016 | Lor | G06F 1/182 |
| 2002/0036888 | A1 * | 3/2002 | Oogami | G06F 1/203 361/679.08 |
| 2006/0132373 | A1 | 6/2006 | Yuanzhu | |
| 2006/0137294 | A1 * | 6/2006 | Waits, Jr. | F16B 5/01 52/787.1 |
| 2006/0192767 | A1 * | 8/2006 | Murakami | G06F 3/0412 345/173 |
| 2007/0218957 | A1 * | 9/2007 | Nishikawa | G06F 3/045 455/566 |
| 2008/0106522 | A1 * | 5/2008 | Nishikawa | G06F 3/045 345/173 |
| 2011/0149194 | A1 | 6/2011 | Nakano | |
| 2012/0236489 | A1 * | 9/2012 | Foo | G06F 1/1635 361/679.32 |
| 2013/0082884 | A1 | 4/2013 | Gummalla | |
| 2013/0141943 | A1 | 6/2013 | Yu et al. | |
| 2014/0063354 | A1 | 3/2014 | Zhang et al. | |
| 2019/0014668 | A1 * | 1/2019 | Ma | G09F 9/00 |

FOREIGN PATENT DOCUMENTS

| | | | |
|---|---|---|---|
| CN | 101976765 A | | 2/2011 |
| CN | 102384413 A | | 3/2012 |
| CN | 202171706 U | * | 3/2012 |
| CN | 202171706 U | | 3/2012 |
| CN | 102841460 A | | 12/2012 |
| CN | 203037957 U | | 7/2013 |
| CN | 103579754 A | | 2/2014 |
| CN | 103636064 A | | 3/2014 |
| CN | 206148075 U | | 5/2017 |
| EP | 2352054 A2 | | 8/2011 |
| KR | 1020060029616 | | 4/2006 |

* cited by examiner

DISPLAY DEVICE

CROSS REFERENCE

The present application is based on International Application No. PCT/CN2017/094830, filed on Jul. 28, 2017, which is based upon and claims priority to Chinese Patent Application No. 201621197628.6, filed on Oct. 28, 2016, titled "DISPLAY DEVICE", and the entire contents thereof are incorporated herein by reference.

TECHNICAL FIELD

The present disclosure generally relates to the field of display technologies, and more particularly, to a display device.

BACKGROUND

In recent years, with the diversified development of functions of display devices, various types of display devices have been used more and more extensively and deeply in all aspects of people's lives.

In the prior art, when the front frame positioned at a light emitting side of a display panel on a display device is fixed, usually it is necessary to widen edges of the front frame and a rear housing to ensure sufficient area for installing a connecting rod so as to fix and connect the front frame to the rear housing via the connecting rod. In this way, a position of the edge of the front frame may be occupied due to a requirement for fixed space of the connecting rod, resulting in a larger edge area of the front frame, which is disadvantageous to a narrow frame design of the display device.

It should be noted that, information disclosed in the above background portion is provided only for better understanding of the background of the present disclosure, and thus it may contain information that does not form the prior art known by those ordinary skilled in the art.

SUMMARY

An embodiment of the present disclosure provides a display device, which includes a front frame, positioned at a light emitting side of the display device; a backlight module; a display panel, positioned between the front frame and the backlight module; and a connecting rod, passing through the backlight module and connected to the front frame. The backlight module includes a panel installation region corresponding to a position of the display panel and a peripheral region adjacent to the panel installation region, and the connecting rod is positioned in the peripheral region.

In an embodiment, the display device further includes a module upper frame. Wherein the module upper frame is positioned between the display panel and the front frame, and the connecting rod passes through the backlight module and the module upper frame and connects to the front frame.

In an embodiment, the display device further includes a rear housing arranged at a side, of the backlight module, departing from the light emitting side of the display device. The peripheral region of the backlight module is internally provided with a through hole. A position, of the rear housing, corresponding to the peripheral region of the backlight module is further provided with a through hole. The connecting rod passes through the through hole in the rear housing and the through hole in the backlight module and connects to the front frame.

In an embodiment, when the display device further includes a module upper frame, the module upper frame is further provided with a through hole; and the connecting rod passes through the through hole of the rear housing, the through hole of the backlight module, and the through hole of the module upper frame, and connects to the front frame.

In an embodiment, a position, of the front frame, corresponding to the connecting rod is provided with a threaded hole, the connecting rod includes a bolt, and the bolt fits with the threaded hole to connect and fix the front frame.

In an embodiment, the bolt is a full thread bolt.

In an embodiment, a position, of the front frame, corresponding to the connecting rod is provided with a positioning hole, the connecting rod includes a positioning pin, and an interference fit exists between the positioning pin and the positioning hole.

In an embodiment, an end face of the positioning pin is a plane.

In an embodiment, a position, of the front frame, corresponding to the connecting rod is provided with a positioning hole, inside the positioning hole and at an end of the connecting rod inserting into the positioning hole there are provided with mutually matched engaging structures, and the mutually matched engaging structures engage and fix the connecting rod to the positioning hole.

In an embodiment, the mutually matched engaging structures are a convex part arranged on a side wall at an end of the connecting rod inserted into the positioning hole and a concave part arranged on a side face of the positioning hole.

In an embodiment, a concave part arranged on a side wall at an end of the connecting rod inserted into the positioning hole and a convex part arranged on a side face of the positioning hole.

In an embodiment, the mutually matched engaging structures are a convex part arranged on an end face at an end of the connecting rod inserted into the positioning hole and a concave part arranged on a bottom surface of the positioning hole.

In an embodiment, a concave part arranged on an end face at an end of the connecting rod inserted into the positioning hole and a convex part arranged on a bottom surface of the positioning hole.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

Figure 1:
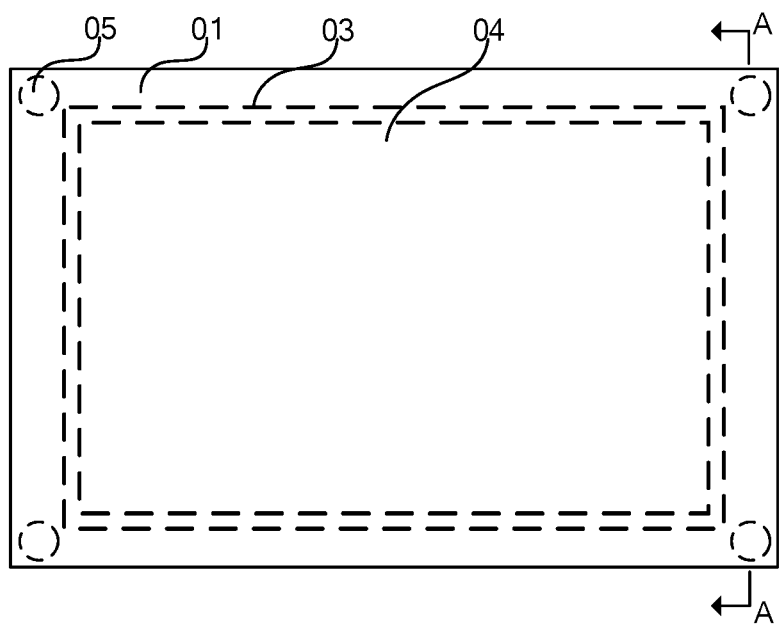
FIG. 1 is a schematic structural diagram of a display device in the prior art.
Figure 2:
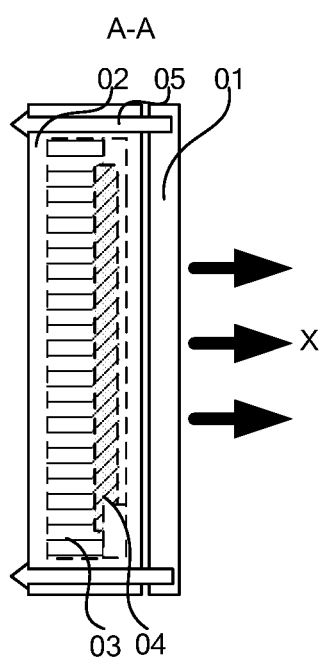
FIG. 2 is a sectional view of FIG. 1 along an A-A direction.

As shown in FIG. 1, when a front frame 01 positioned at a light emitting side of a display panel 04 on the display device is fixed, generally it is needed to widen edges of the front frame 01 and of a rear housing to ensure enough region for installing a connecting rod 05, so that the front frame 01 is directly fixedly connected to the rear housing 02 via the connecting rod 05, as shown in FIG. 2. As a result, the position of the edge of the front frame 01 is occupied due to fixed space requirements of the connecting rod 05, which causes a larger edge region of the front frame 01, making it disadvantageous to a narrow frame design of the display device.

Figure 3:
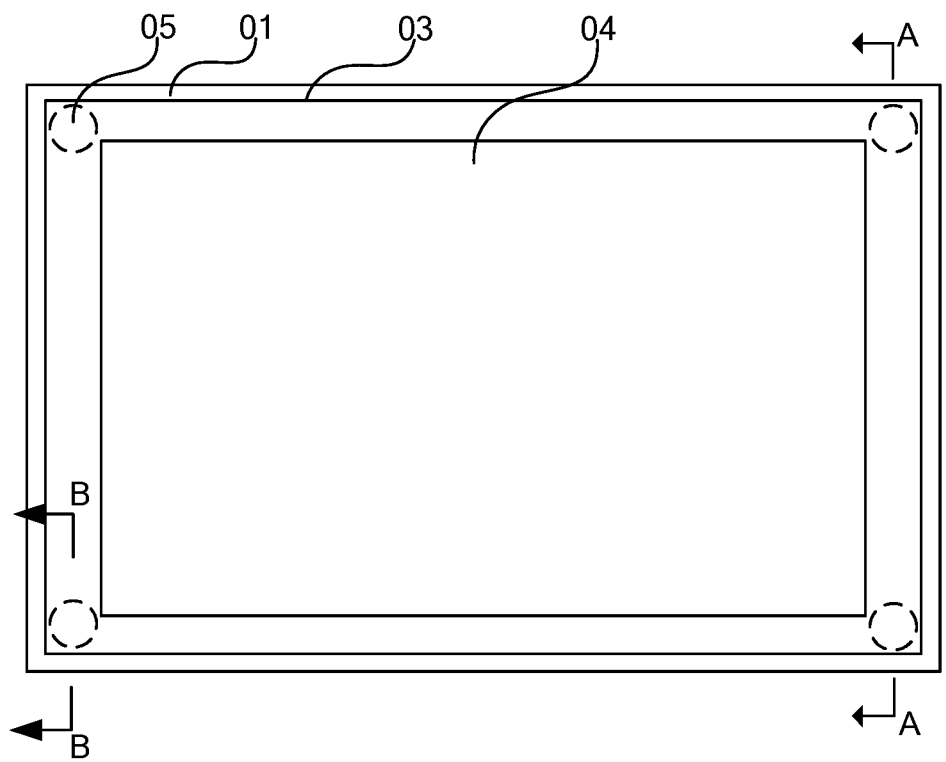
FIG. 3 is a schematic structural diagram of a display device according to an embodiment of the present disclosure.
Figure 4:
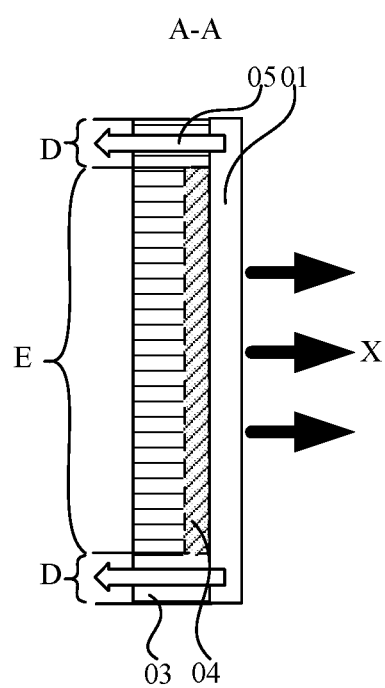
FIG. 4 is a sectional view of FIG. 3 along an A-A direction.

An embodiment of the present disclosure provides a display device. As shown in FIG. 3, the display device includes a backlight module 03 and a display panel 04, and further includes a front frame 01, which is installed at a light emitting side X of the display device. The display panel 04 is positioned between the front frame 01 and the backlight module 03. The connecting rod 05 passes through the backlight module 03 and connects to the front frame 01. As shown in FIG. 4, the backlight module 03 includes a panel installation region E corresponding to a position of the display panel 04 and a peripheral region D adjacent to the panel installation region E, and the connecting rod 05 is positioned in the peripheral region D.

It is to be noted that the backlight module 03 includes a panel installation region E corresponding to a position of the display panel 04 and a peripheral region D adjacent to the panel installation region E. That is, an area of the backlight module 03 is larger than that of the display panel 04. Therefore, the connecting rod 05 can be arranged in the peripheral region D.

Figure 5:
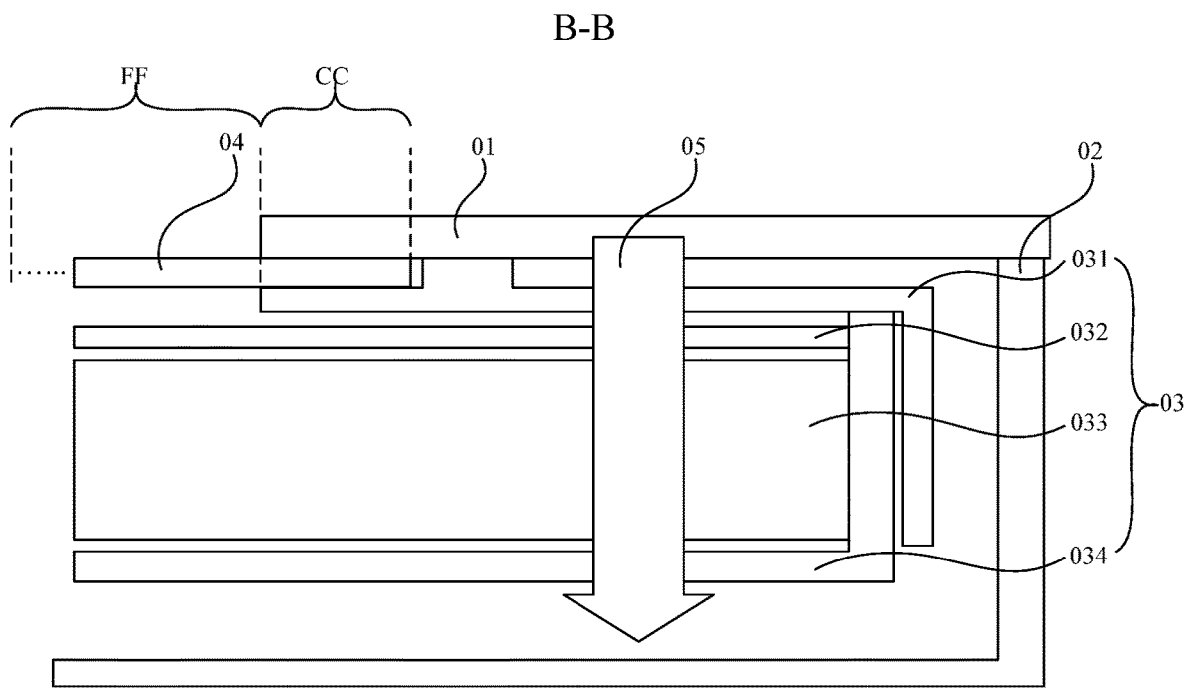
FIG. 5 is a sectional view of FIG. 3 along a B-B direction.

In addition, as shown in FIG. 5, the display panel 04 includes a display area FF (the display area FF in FIG. 5 is not completely shown due to limitation of a cut position) whose center is used for displaying a picture, and a display panel peripheral region CC around the display area FF. The front frame 01 covers the display panel peripheral region CC of the display panel 04 and is fixedly connected to the backlight module 03. The position of the display panel 04 between the front frame 01 and the backlight module 03 is fixed, which does not have a negative effect on normal picture display of the display area FF of the display panel 04.

An embodiment of the present disclosure provides a display device. The display device includes a backlight module and a display panel, and further includes a front frame, which is installed at a light emitting side of the display device. The display panel is positioned between the front frame and the backlight module. The connecting rod passes through the peripheral region of the backlight module and connects to the front frame. The backlight module includes a panel installation region corresponding to a position of the display panel and a peripheral region adjacent to the panel installation region, and the connecting rod is positioned in the peripheral region. The backlight module is divided into the panel installation region for installing the display panel and the peripheral region adjacent to the panel installation region, and the connecting rod is fixedly connected to the front frame through the peripheral region of the backlight module, so that the front frame can be directly fixedly connected to the rear housing without widening the edge of the front frame. Therefore, the edge region of the front frame to be fixed to the rear housing in the prior art can be reduced, and the frame area of the display panel is downsized.

Figure 7:
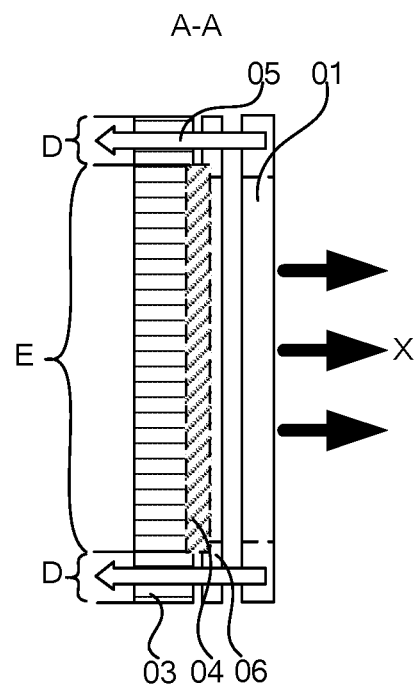
FIG. 7 is a sectional view of FIG. 3 along an A-A direction when a module upper frame is provided.

In addition, to ensure that the display panel 04 of the display device is fixedly stably and reliably, as shown in FIG. 7, the display device further includes a module upper frame 06. The module upper frame 06 is positioned between the display panel 04 and the front frame 01, and the connecting rod 05 passes through the backlight module 03 and the module upper frame 06 and connects to the front frame 01.

It is also to be noted that in the display device of the present disclosure, when the module upper frame 06 is provided, the module upper frame 06 is a rectangular hollow frame arranged along the peripheral region CC of the display panel 04, wherein the module upper frame 06 is used for fixing the display panel 04 in collaboration with the backlight module 03. Therefore, to make sure the front frame 01 of the display device is effectively fixed, it is required to place the display panel 04 in the panel installation region E of the backlight module 03, to cover the module upper frame 06 at the light emitting side X of the display panel 04, and to fix the module upper frame 06 to the backlight module 03. The display panel 04 is fixed through the backlight module 03 and the module upper frame 06 at two sides of the display panel 04, and then the front frame 01 is fixedly connected to the module upper frame 06 and the backlight module 03 via the connecting rod 05. In this way, the position of the front frame 01 can be fixed.

Figure 8:
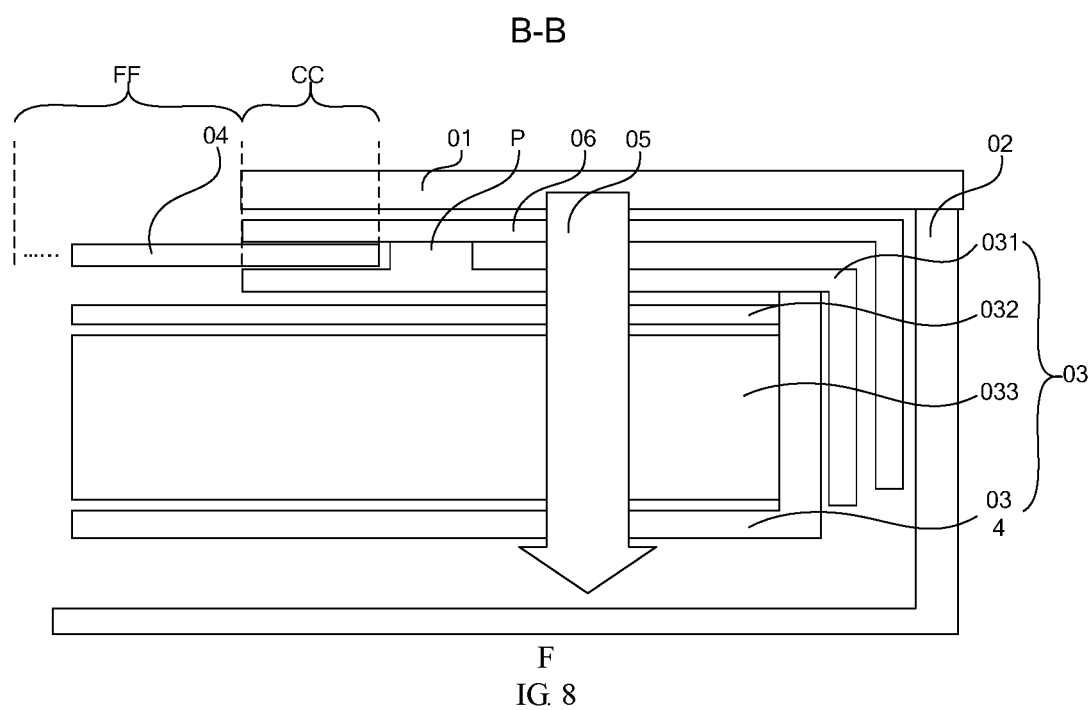
FIG. 8 is a sectional view of FIG. 3 along a B-B direction when the module upper frame is provided.

As shown in FIG. 8, when the display device includes the module upper frame 06, the module upper frame 06 covers the peripheral region CC of the display panel 04 and is fixedly connected to the backlight module 03. The position of the display panel 04 between the module upper frame 06 and the backlight module 03 is fixed, which likewise does not have a negative effect on normal picture display of the display area FF of the display panel 04. Furthermore, the module upper frame 06 is fixedly connected to the backlight module 03, which can enhance the stability of fixation of the display panel 04.

Figure 6:
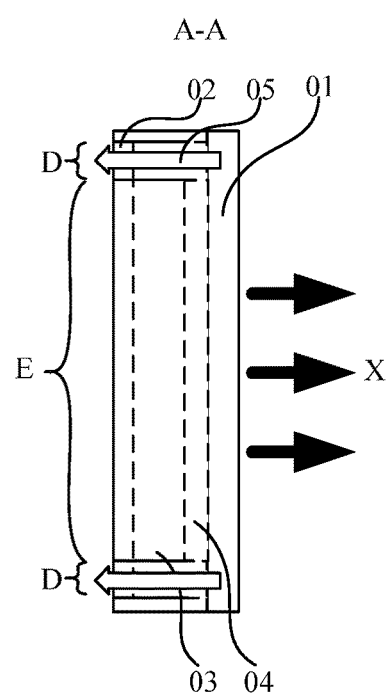
FIG. 6 is another case of the sectional view of FIG. 3 along an A-A direction.
Figure 9:
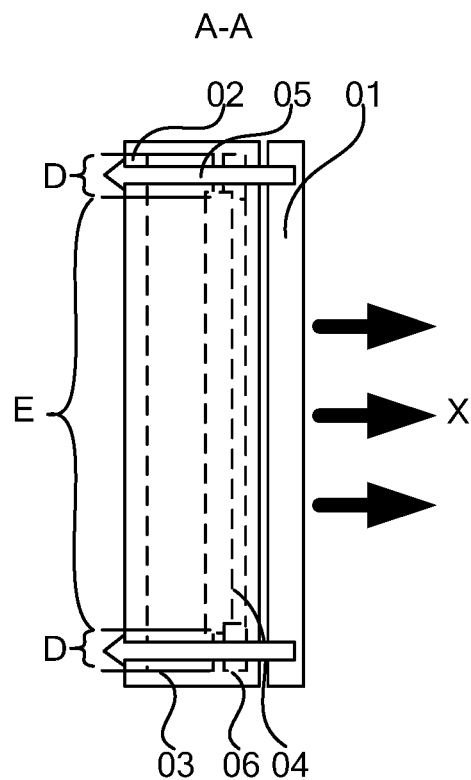
FIG. 9 is another case of the sectional view of FIG. 3 along an A-A direction when the module upper frame is provided.

In addition, as shown in FIG. 6, the display device further includes a rear housing 02 arranged at a side, of the backlight module 03, departing from the light emitting side X of the display device. The peripheral region D of the backlight module 03 is internally provided with a through hole O. A position, of the rear housing 02, corresponding to the peripheral region D of the backlight module 03 is also provided with a through hole O. The connecting rod passes through the through hole in the rear housing 02 and the through hole O in the backlight module 03 and connects to the front frame 01. Alternatively, as shown in FIG. 9, when the display device further includes the module upper frame 06, the module upper frame 06 also is provided with a through hole O, and the connecting rod 05 passes through the through hole O of the rear housing 02, the through hole O of the backlight module 03, and the through hole O of the module upper frame 06, and connects to the front frame 01.

In the following, detailed description is made to, for a case where the display device includes the module upper frame 06, specific requirements for arranging a through hole O on each part of the display device and manners of fixing the front frame 01 through the through holes O of different sizes.

Specifically, for example, as shown in FIG. 8, the through holes O are provided on the module upper frame 06 and the backlight module 03. A hole diameter of the through hole O fits to a cross-sectional diameter of the connecting rod 05. When successively passing through the module upper frame 06 and the backlight module 03, the connecting rod 05 can be fixedly connected to each module of the module upper frame 06 and the backlight module 03, so that the position of the front frame 01 is fixed. On this basis, when the display device further includes a rear housing 02, the rear housing 02 is installed after the front frame 01 of the display device is fixedly connected between the backlight module 03 and the module upper frame 06 through the connecting rod 05, and then the rear housing 02 is connected and fixed to the display device. In this way, the rear housing 02 may be fixed by way of pasting, press fit, interference fit and so on. However, the present disclosure is not limited thereto. It is not required to arrange the through hole O for passing through the connecting rod 05 on the rear housing 02. Thus, the rear housing 02 of the display device after installation is a smooth and complete plane, and the connecting rod 05 is not exposed.

Figure 10:
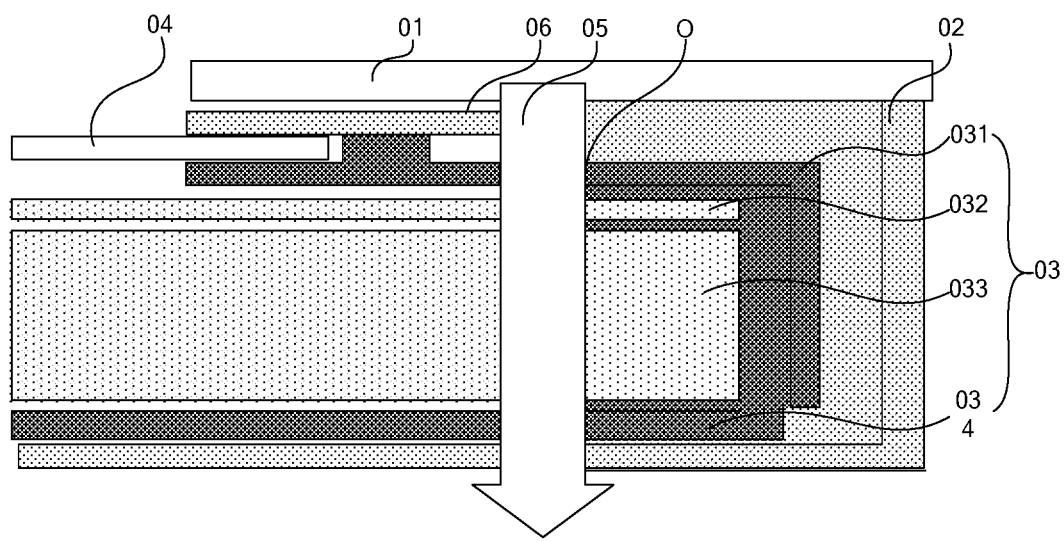
FIG. 10 is a sectional view of an exemplary through hole setting mode in FIG. 3 along a B-B direction.

For another example, as shown in FIG. 10, the hole diameters of the through holes O on the module upper frame 06, the backlight module 03 and the rear housing 02 fit to the cross-sectional diameter of the connecting rod 05. When the connecting rod 05 successively passes through the module upper frame 06, the backlight module 03 and the rear housing 02, the connecting rod 05 can be fixedly connected to each module of the module upper frame 06 and the backlight module 03 and the rear housing 02. Meanwhile the module frame 031 in the module upper frame 06 and the backlight module 03 fix the display panel 04. In this way, each part of the whole display device can be fixedly connected by means of the connecting rod 05, so that it is not required to arrange other connecting parts on the display device.

Figure 11:
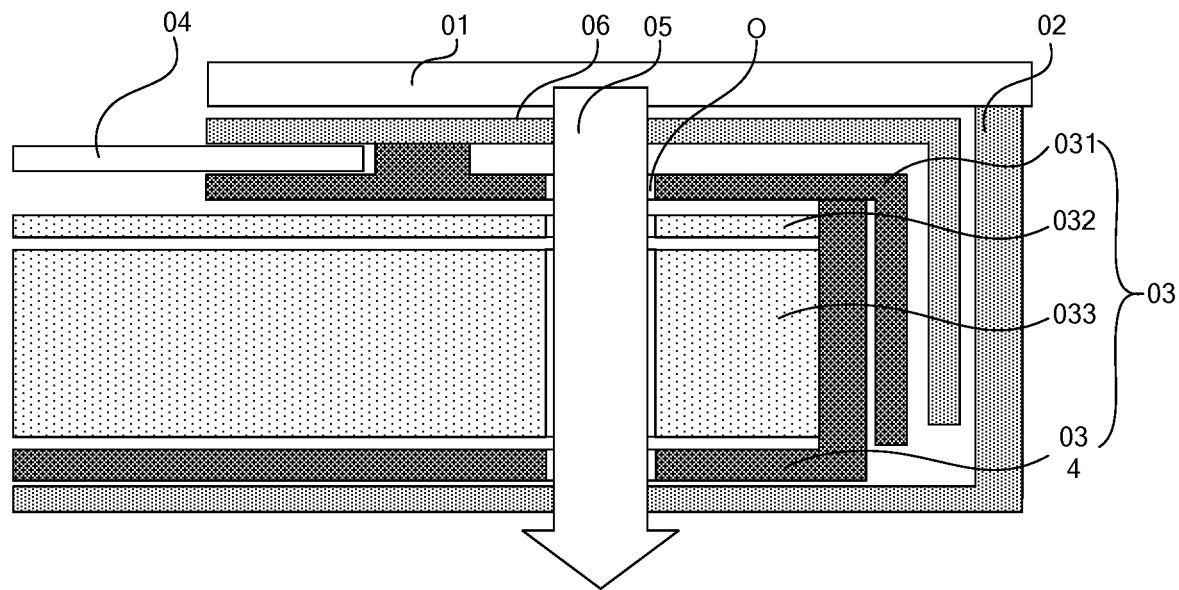
FIG. 11 is a sectional view III of another exemplary through hole setting mode in FIG. 3 along a B-B direction.

For another example, as shown in FIG. 11, the hole diameter of the through hole O on the module upper frame 06 and the rear housing 02 also may be set to fit to the cross-sectional diameter of the connecting rod 05, the hole diameter of the through hole O of each component on the backlight module 03 is set to be larger than the cross-sectional diameter of the connecting rod 05. Thus, when the connecting rod 05 successively passes through the module upper frame 06, the backlight module 03 and the rear housing 02, since the hole diameter of the through hole O of the module upper frame 06 and of the rear housing 02 fits to the cross-sectional diameter of the connecting rod 05, when passing through the through hole O of the module upper frame 06 and of the rear housing 02, the connecting rod 05 fits to and is fixedly connected between the module upper frame 06 and the rear housing 02, and the relative position therebetween is fixed. Because the hole diameter of the through hole O of each component in the backlight module 03 is larger than the cross-sectional diameter of the connecting rod 05, the connecting rod 05 passes through each component of the backlight module 03 without coming in contact with the each component of the backlight module 03, thereby avoiding the problem that it is difficult for the components such as the optical film material 032 and the light guide plate 033 in the backlight module 03 to connect and fix the connecting rod 05 because of being thinner in thickness and softer in material.

The module frame 031 on the backlight module 03 needs to fix the position of the display panel 04 jointly with the module upper frame 06. Therefore, it is also required to separately fixedly connect the backlight module 03 to the front frame 01 or the rear housing 02 by way of the connecting rod 05, so that the backlight module 03 remains fixed to the front frame 01 or the rear housing 02.

Figure 12:
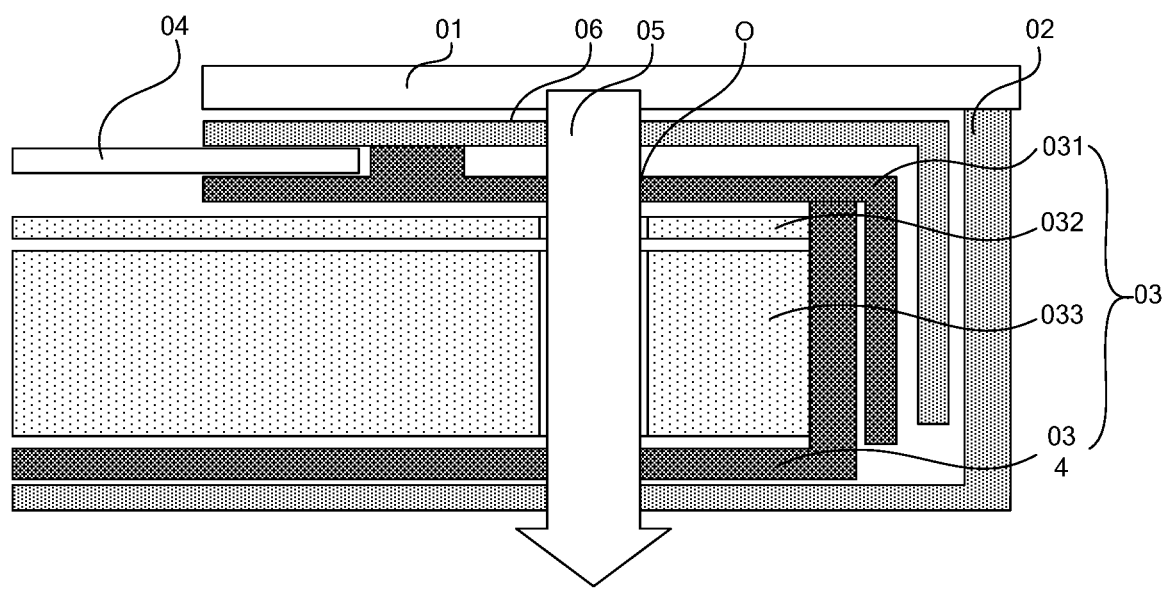
FIG. 12 is a sectional view IV of a still another exemplary through hole setting mode in FIG. 3 along a B-B direction.

For another example, as shown in FIG. 12, the hole diameter of the through hole O on the module upper frame 06 and the rear housing 02 is set to fit to the cross-sectional diameter of the connecting rod 05, the hole diameter of the through hole O of the module frame 031 and a backplate 034 in the backlight module 03 is also set to fit to the cross-sectional diameter of the connecting rod 05, and the hole diameter of the through hole O of the optical film material 032 and the light guide plate 033 in the backlight module 03 is set to be larger than the cross-sectional diameter of the connecting rod 05. In this way, in one aspect, the hole diameter of the through hole O of the module upper frame 06, the module frame 031, the backplate 034 and the rear housing 02 fits to the cross-sectional diameter of the connecting rod 05. When passing through the through hole O of the module upper frame 06, of the module frame 031, of the backplate 034 and of the rear housing 02, the connecting rod 05 fits to and is closely connected to the module upper frame 06, the module frame 031, the backplate 034 and the rear housing 02, and a relative position therebetween is fixed. The module frame 031 and the backplate 034 in the backlight module 03 are fixedly connected to the connecting rod 05, and the optical film material 032 and the light guide plate 033 are fixed to an inner side of the backplate 034, so that the backlight module 03 and each component in the backlight module 03 are fixed in position. In another aspect, the hole diameter of the through hole O of the optical film material 032 and the light guide plate 033 in the backlight module 03 is set to be larger than the cross-sectional diameter of the connecting rod 05, so that the connecting rod 05 passes through the through hole O of the optical film material 032 and the light guide plate 033 without coming in contact with the optical film material 032 or the light guide plate 033, thereby avoiding the problem that it is difficult for the optical film material 032 and the light guide plate 033 to connect and fix the connecting rod 05.

In the following, a connection manner as shown in FIG. 12, where the front frame 01, the module upper frame 06, the module frame 031, the backplate 034 and the rear housing 02 are fixedly connected, is taken as an example to provide a detailed description of specific arrangement of the connecting rod 05 and of the through hole O fitting to the connecting rod 05 and the connection manner therebetween.

Figure 13:
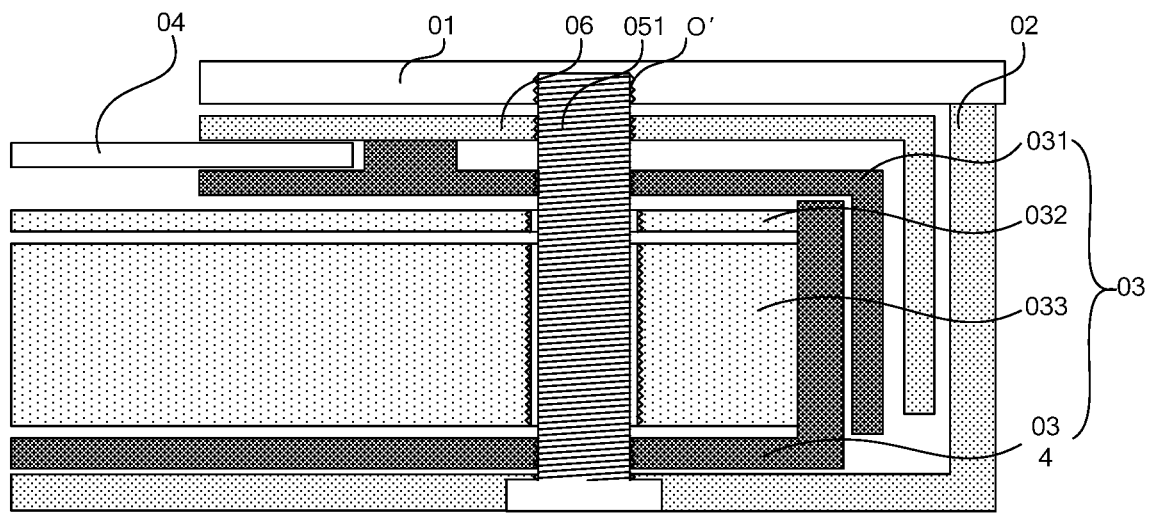
FIG. 13 is a sectional view V of a threaded hole in FIG. 3 along a B-B direction.

For example, as shown in FIG. 13, the connecting rod 05 is a bolt 051, a threaded hole O' fitting to the bolt 051 is provided at a position, on the front frame 01, corresponding to the connecting rod 05, and the bolt 051 fits to the threaded hole O' to connect and fix the front frame 01.

A cylinder side face of the bolt 051 is provided with a thread, an inner wall of the threaded hole O' is also provided with a thread, and the thread on the bolt 051 is the same as that on the inner wall of the threaded hole O' in thread pitch, direction of spiral and helix angle, so that when the bolt 051 is screwed into the threaded hole O', the thread on the bolt 051 can fit to that on the inner wall of the threaded hole O'. Therefore, the front frame 01 provided with the threaded hole O', the module upper frame 06, the module frame 031, the backplate 034 and the rear housing 02 may be fixedly connected via the bolt 051 without additional attaching nuts.

For the optical film material 032 and the light guide plate 033 not coming in contact with the front frame 01, spiral connection of the thread on the bolt 051 may be avoided only by increasing the hole diameter of the threaded hole O' on the optical film material 032 and the light guide plate 033.

A plane figure shape of the thread is not specifically limited in the present disclosure, and a triangular thread, a rectangular thread, a trapezoidal thread and a buttless thread and so on are acceptable. Furthermore, a direction of spiral and a helix angle of the thread also is not specifically limited as long as the bolt 051 can be screwed down and fixed to the threaded hole O' through fitting threads.

The front frame 01 is connected and fixed by fitting the bolt 051 to the threaded hole O' in a simple fixation mode. The threads of the bolt 051 and the threaded hole O' are not difficult to process, the connection is secure and stable, and assembly or disassembly may be implemented by a conventional screw driver. Thus, the assembly and disassembly operation of the display device is convenient.

Further, as shown in FIG. 13, a full thread bolt is selected and used as the bolt 051.

Thus, when the relative position between parts on the display device is changed, it is not required to replace the bolt 051 provided with corresponding thread position. It is only required to increase or decrease the number of rotations of parts on the bolt 051 according to requirements for the relative positions. Therefore, the display device is simple in operation and convenient for use.

On this basis, as shown in FIG. 13, a countersunk bolt is selected and used as the bolt 051. Upon installation of the countersunk bolt, a tail thereof is housed in a groove on the rear housing 02. In one aspect, the total thickness of the display device after the installation can be reduced; and in another aspect, the visual effect of the display device is better.

Figure 14:
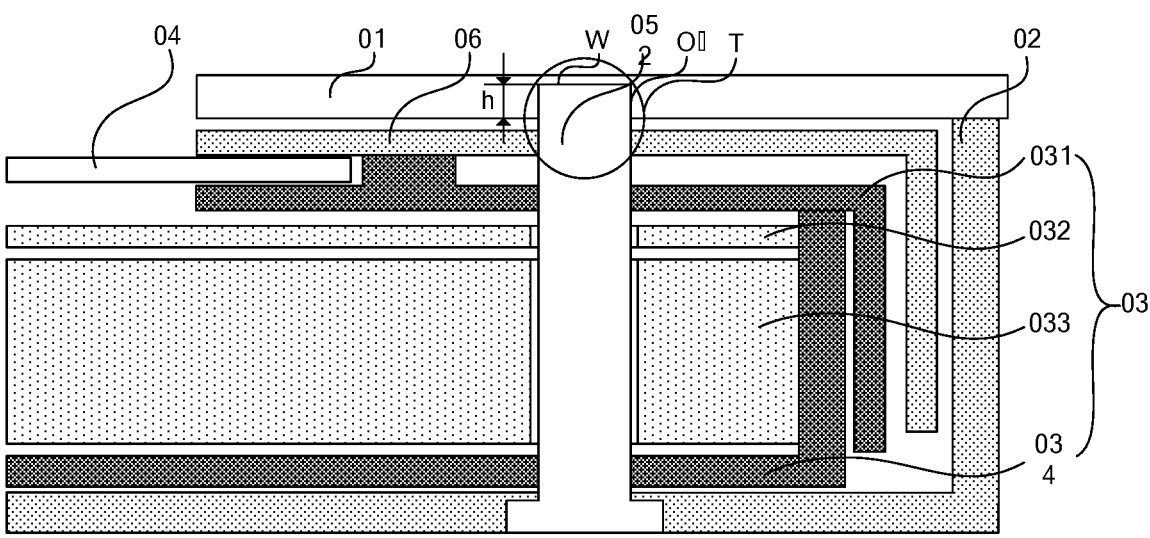
FIG. 14 is a sectional view VI of a positioning hole in FIG. 3 along a B-B direction.

For another example, as shown in FIG. 14, the connecting rod 05 is a positioning pin 052, a positioning hole O" fitting to the positioning pin 052 is arranged at a position, on the front frame 01, corresponding to the connecting rod 05, and an interference fit exists between the positioning pin 052 and the positioning hole O".

The hole diameter of the positioning hole O" is smaller than an axis diameter of the positioning pin 052. After being installed into the positioning hole O" by a dedicated interference fit installation tool, the positioning pin 052 may tightly fit to the positioning hole O". Alternatively, according to a principle of thermal expansion and contraction, during interference fit installation, the positioning pin 052 is heated, or a part provided with the positioning hole O" is cooled, and the interference fit may be implemented after the positioning pin 052 fitting to the positioning hole O" is returned to a normal temperature.

Based on different materials of two parts of interference fit, a setting relationship between the hole diameter and the axis diameter of the two parts of interference fit is specifically calculated, and the two parts are processed according to the calculated numerical values. The specific sizes of the two parts having the relationship of interference fit is not limited in the present disclosure as long as tight connection of interference fit between the positioning pin 052 and the positioning hole O" can be implemented.

In addition, as shown in FIG. 14, an end surface W of the positioning pin 052 is a plane.

Thus, in case that the size of the positioning hole O" on the front frame 01 is not changed, a length, of an end of the positioning pin 052, extending towards a bottom of the positioning hole O" is eliminated because the end surface W of the positioning pin 052 is a plane, so that a contact height h between side walls of the positioning pin 052 and the positioning hole O" of the front frame 01 is the maximum to increase the contact area of an interference fit portion between the positioning pin 052 and the positioning hole O" and improve the stability of fixed connection between the positioning pin 052 and the positioning hole O".

On this basis, as shown in FIG. 14, a cylindrical pin whose tail is a plane is selected and used as the positioning pin 052. Thus, after the front frame 01 of the display device is fixed by the cylindrical pin, the tail of the cylindrical pin can fully keep flush with an external surface of the rear housing 02, so that the external surface of the rear housing 02 forms a smooth plane, and thus the aesthetic appearance of the display device may be further improved.

Figure 15:
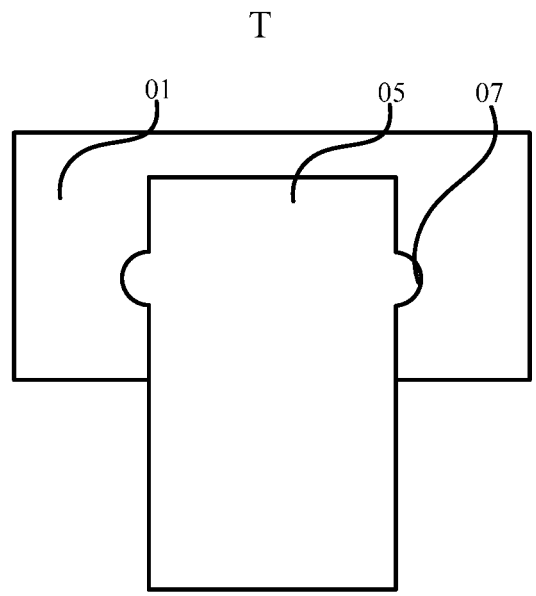
FIG. 15 is a partial enlarged view I of Region T in FIG. 14.

For another example, as shown in FIG. 14, a position, of the front frame 01, corresponding to the connecting rod 05 is provided with a positioning hole O"; as shown in FIG. 15, inside the positioning hole O" and at an end of the connecting rod 05 inserting into the positioning hole O" there are provided with mutually matched engaging structures 07, and the mutually matched engaging structures 07 engage and fix the connecting rod 05 and the positioning hole O".

In the following, specific positions of arranging the mutually matched engaging structures 07 at the connecting rod 05 and the positioning hole O" are described in detail.

Figure 16:
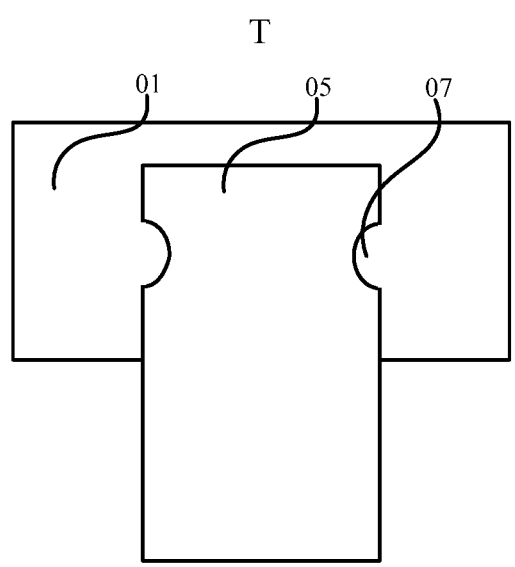
FIG. 16 is a partial enlarged view II of Region T in FIG. 14.

For example, as shown in FIG. 15, the mutually matched engaging structures 07 are a convex part arranged on a side wall at an end of the connecting rod 05 inserted into the positioning hole O" and a concave part arranged on a side face of the positioning hole O", or, as shown in FIG. 16, a concave part arranged on a side wall at an end of the connecting rod 05 inserted into the positioning hole O" and a convex part arranged on a side face of the positioning hole O".

Figure 17:
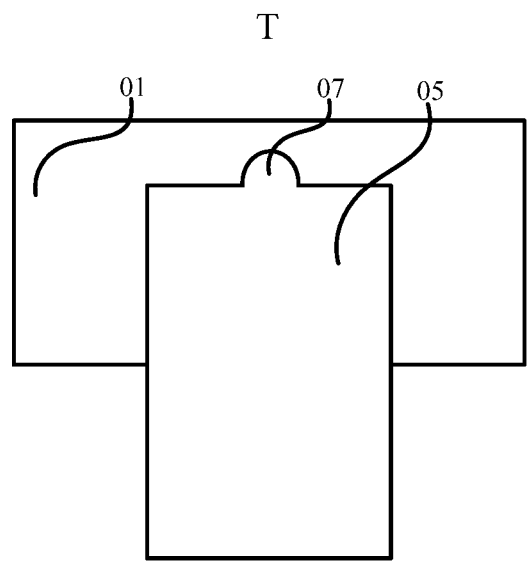
FIG. 17 is a partial enlarged view III of Region T in FIG. 14.
Figure 18:
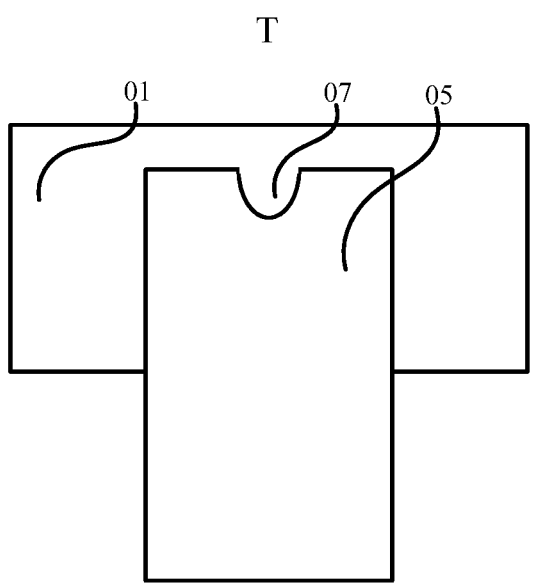
FIG. 18 is a partial enlarged view IV of Region T in FIG. 14.

For another example, as shown in FIG. 17, the mutually matched engaging structures 07 are a convex part arranged on an end face at an end of the connecting rod 05 inserted into the positioning hole O" and a concave part arranged on a bottom surface of the positioning hole O", or, as shown in FIG. 18, a concave part arranged on an end face at an end of the connecting rod 05 inserted into the positioning hole O" and a convex part arranged on a bottom surface of the positioning hole O".

The specific shape of the engaging structures 07 is not limited in the present disclosure, which may be the circular arc as shown in FIG. 15-FIG. 18, or also may be a triangle, a trapezium, a rectangle or the like, as long as snap-fit can be implemented. To further improve the effect of fixed connection of the connecting rod 05, it is possible to provide a plurality of the engaging structures 07. The number of the engaging structures 07 is not limited in the present disclosure. In addition, when the engaging structures 07 are arranged on the side wall of the connecting rod 05, the engaging structures 07 also may be cyclic structures arranged, along a horizontal direction, on the side wall of the connecting rod 05, and correspondingly, the lateral surface of the positioning hole O" also is a cyclic structure arranged along the horizontal direction.

The above connection mode is also applicable to a case where the display device does not include the module upper frame 06, which is not unnecessarily described herein.

The above is merely specific embodiments of the present disclosure, but the protection scope of the present disclosure is not limited thereto. Any variation or substitution easily conceivable to those skilled in the art shall fall into the protection scope of the present disclosure. Therefore, the protection scope of the present disclosure shall be subject to the protection scope of the claims.

What is claimed is:

1. A display device, comprising:
   a front frame, positioned at a light emitting side of the display device;
   a backlight module;
   a display panel, positioned between the front frame and the backlight module; and
   a connecting rod, passing through the backlight module and connected to the front frame, the connecting rod does not penetrate a side of the front frame facing the light emitting side;
   wherein the backlight module comprises a panel installation region corresponding to a position of the display panel and a peripheral region adjacent to the panel installation region, and the connecting rod is positioned in the peripheral region,
   wherein the display device further comprises a module upper frame, wherein the module upper frame is a separate structure, and positioned between the display panel and the front frame, and the connecting rod passes through the backlight module and the module upper frame and connects to the front frame.

2. The display device according to claim 1, further comprising a rear housing arranged at a side, of the backlight module, departing from the light emitting side of the display device, wherein the peripheral region of the backlight module is internally provided with a through hole, a position, of the rear housing, corresponding to the peripheral region of the backlight module is further provided with a through hole, and the connecting rod passes through the through hole in the rear housing and the through hole in the backlight module and connects to the front frame.

3. The display device according to claim 2, further comprising a module upper frame, wherein the module upper frame is positioned between the display panel and the front frame, and the connecting rod passes through the backlight module and the module upper frame and connects to the front frame, wherein the module upper frame is further provided with a through hole, and the connecting rod passes through the through holes of the rear housing, the backlight module, and the module upper frame, and connects to the front frame.

4. The display device according to claim 2, wherein a position, of the front frame, corresponding to the connecting rod is provided with a threaded hole, the connecting rod comprises a bolt, and the bolt fits with the threaded hole to connect and fix the front frame.

5. The display device according to claim 4, wherein the bolt is a full thread bolt.

6. The display device according to claim 2, wherein a position, of the front frame, corresponding to the connecting rod is provided with a positioning hole, the connecting rod comprises a positioning pin, and an interference fit exists between the positioning pin and the positioning hole.

7. The display device according to claim 6, wherein an end face of the positioning pin is a plane.

8. The display device according to claim 2, wherein a position, of the front frame, corresponding to the connecting rod is provided with a positioning hole, there are provided with mutually matched engaging structures between the positioning hole and an end portion of the connecting rod inserting into the positioning hole, and the mutually matched engaging structures engage and fix the connecting rod to the positioning hole.

9. The display device according to claim 8, wherein the mutually matched engaging structures are a convex part arranged on a side wall at an end of the connecting rod inserted into the positioning hole and a concave part arranged on a side face of the positioning hole.

10. The display device according to claim 8, wherein the mutually matched engaging structures are a convex part arranged on an end face at an end of the connecting rod inserted into the positioning hole and a concave part arranged on a bottom surface of the positioning hole.

11. The display device according to claim 8, wherein the mutually matched engaging structures are a concave part arranged on a side wall at an end of the connecting rod inserted into the positioning hole and a convex part arranged on a side face of the positioning hole.

12. The display device according to claim 8, wherein the mutually matched engaging structures are a concave part arranged on an end face at an end of the connecting rod inserted into the positioning hole and a convex part arranged on a bottom surface of the positioning hole.

13. The display device according to claim 1, further comprising a rear housing arranged at a side, of the backlight module, departing from the light emitting side of the display device, wherein the peripheral region of the backlight module is internally provided with a through hole, a position, of the rear housing, corresponding to the peripheral region of the backlight module is further provided with a through hole, and the connecting rod passes through the through hole in the rear housing and the through hole in the backlight module and connects to the front frame.

14. The display device according to claim 13, wherein a position, of the front frame, corresponding to the connecting rod is provided with a threaded hole, the connecting rod comprises a bolt, and the bolt fits with the threaded hole to connect and fix the front frame.

15. The display device according to claim 14, wherein the bolt is a full thread bolt.

16. The display device according to claim 13, wherein a position, of the front frame, corresponding to the connecting rod is provided with a positioning hole, the connecting rod comprises a positioning pin, and an interference fit exists between the positioning pin and the positioning hole.

17. The display device according to claim 13, wherein a position, of the front frame, corresponding to the connecting rod is provided with a positioning hole, there are provided with mutually matched engaging structures between the positioning hole and an end portion of the connecting rod inserting into the positioning hole, and the mutually matched engaging structures engage and fix the connecting rod to the positioning hole.

18. The display device according to claim 17, wherein the mutually matched engaging structures are a convex part arranged on a side wall at an end of the connecting rod inserted into the positioning hole and a concave part arranged on a side face of the positioning hole.

19. The display device according to claim 17, wherein the mutually matched engaging structures are a convex part arranged on an end face at an end of the connecting rod inserted into the positioning hole and a concave part arranged on a bottom surface of the positioning hole.

* * * * *